United States Patent [19]

Havel

[11] Patent Number: 5,003,298

[45] Date of Patent: Mar. 26, 1991

[54] VARIABLE COLOR DIGITAL DISPLAY FOR EMPHASIZING POSITION OF DECIMAL POINT

[76] Inventor: Karel Havel, 15 Kensington Road, Apt. #704, Bramalea, ON, L6T 3W2

[21] Appl. No.: 379,616

[22] Filed: Jul. 14, 1989

Related U.S. Application Data

[62] Division of Ser. No. 197,322, May 23, 1988, which is a division of Ser. No. 819,111, Jan. 15, 1986, Pat. No. 4,794,383.

[51] Int. Cl.$^5$ .......................... G01F 23/24; G09L 3/00
[52] U.S. Cl. .................................... 340/701; 340/703; 340/756
[58] Field of Search ............... 340/701, 702, 703, 753, 340/754, 756

[56] References Cited

U.S. PATENT DOCUMENTS

| | | | |
|---|---|---|---|
| 3,577,031 | 5/1971 | McCormick | 340/701 |
| 3,719,849 | 3/1973 | Steward | 340/756 |
| 3,878,380 | 4/1975 | Tsuiki | 340/756 |
| 3,924,227 | 12/1975 | Stolov | 340/702 |
| 4,064,687 | 12/1977 | Kashio | 340/756 |
| 4,488,149 | 12/1984 | Givens | 340/702 |
| 4,688,029 | 8/1987 | Kawaski et al. | 340/754 |

Primary Examiner—Alvin E. Oberley

[57] ABSTRACT

A variable color digital display includes a scanner for interrogating an exhibited string of digits to determine the position of a decimal point. Color control accordingly illuminates all digits that precede the decimal point in a first color and all digits that follow the decimal point in a second color.

6 Claims, 3 Drawing Sheets

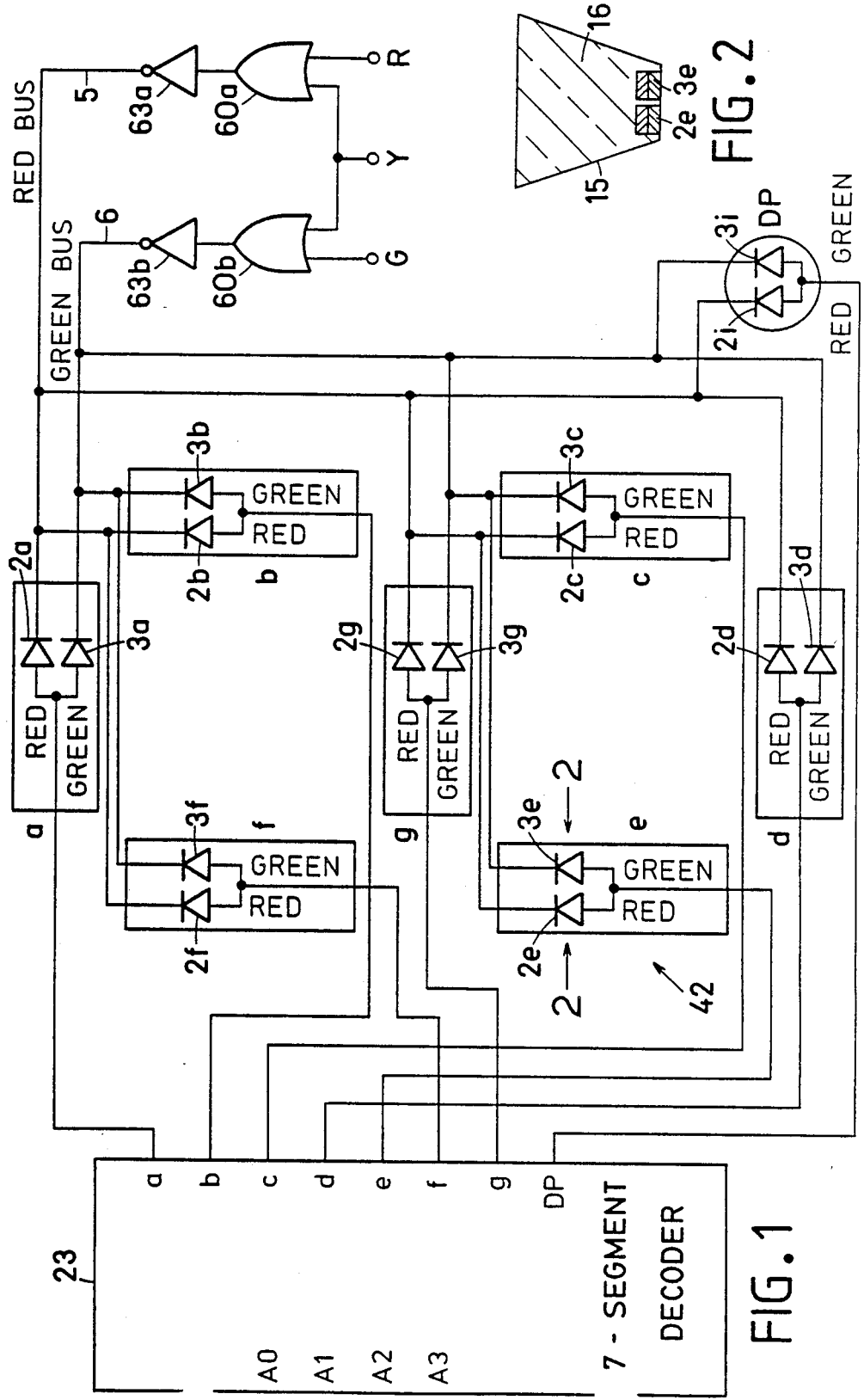

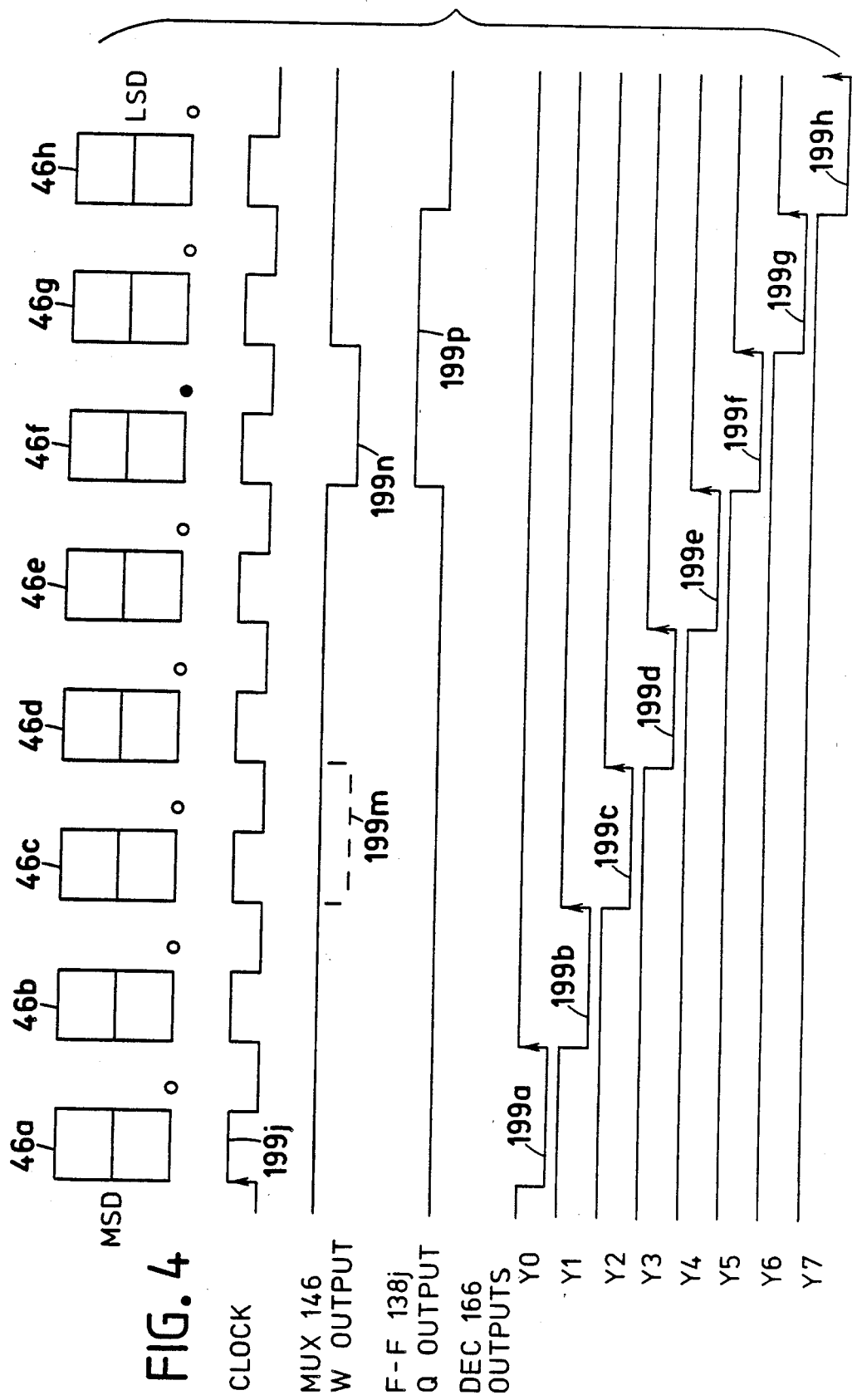

VARIABLE COLOR DIGITAL DISPLAY FOR EMPHASIZING POSITION OF DECIMAL POINT

CROSS-REFERENCE TO RELATED APPLICATIONS

This is a division of my copending application Ser. No. 07/197,322, filed on May 23, 1988, entitled Variable Color Digital Multimeter, which is a division of my application Ser. No. 06/819,111, filed on Jan. 15, 1986, entitled Variable Color Digital Multimeter, now U.S. Pat. No. 4,794,383 issued on Dec. 27, 1986.

Reference is also made to my related applications Ser. No. 06/817,114, filed on Jan. 8, 1986, entitled Variable Color Digital Timepiece, now U.S. Pat. No. 4,647,217 issued on Mar. 3, 1987, and Ser. No. 06/839,526, filed on Mar. 14, 1986, entitled Variable Color Display Telephone, now U.S. Pat. No. 4,726,059 issued on Feb. 16, 1988.

BACKGROUND OF THE INVENTION

1. Field of the Invention

This invention relates to variable color display devices.

2. Description of the Prior Art

The difficulty of rapidly detecting the position of a decimal point in a long string of digits, displayed on a multi-element digital display which includes a large number of display segments, is appreciated in the prior art.

A monochromatic multi-digit display disclosed in U.S. Pat. No. 3,719,849, issued on Mar. 6, 1973 to Robert L. Steward, dedicates one digit position to a decimal point. When a string of digits is displayed, only the decimal point is energized on one display digit to provide wide separation between the decimal point and its nearby digits, for improving the readability of the decimal point in a long string of digits. Since one display position is sacrificed, the resolution of the display is diminished.

SUMMARY OF THE INVENTION

It is the principal object of this invention to provide an improved variable color digital display.

It is another object of the invention to provide a variable color digital display for exhibiting decimal numbers such that digits that precede the decimal point are illuminated in a first color, and digits that follow the decimal point are illuminated in a second color, to more effectively emphasize the position of the decimal point.

BRIEF DESCRIPTION OF THE DRAWINGS

In the drawings in which is shown the preferred embodiment of the invention,

FIG. 1 is a schematic diagram of a single 2-primary color 7-segment display element.

FIG. 2 is an enlarged cross-sectional view of one display segment in FIG. 1, taken along the line 2—2.

FIG. 4 is a timing diagram of the circuit shown in FIG. 3.

Throughout the drawings, like characters indicate like parts.

DESCRIPTION OF THE PREFERRED EMBODIMENT

Figure 3:
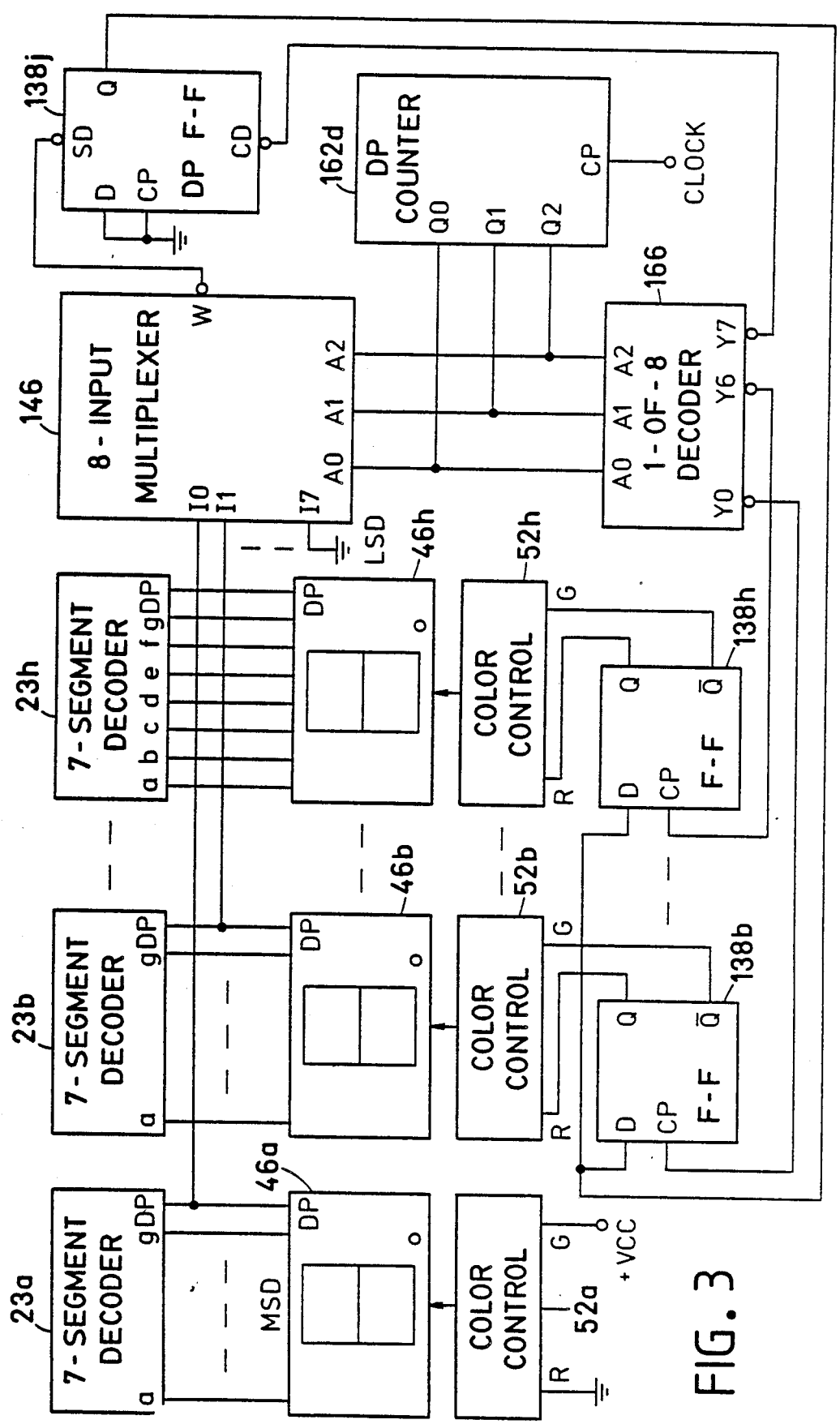
FIG. 3 is a simplified schematic diagram of a variable color digital display for exhibiting decimal numbers such that digits preceding and following the decimal point are illuminated in respectively different colors.

Referring now, more particularly, to the drawings, in FIG. 1 is shown a schematic diagram of a 2-primary color common cathodes 7-segment display element 42 which can selectively display various digital fonts in different colors on display segments a, b, c, d, e, f, g, and DP (decimal point). Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e.g., the red LED in the segment a is designated as 2a, etc.

The anodes of all red and green LED pairs are interconnected in each display segment and are electrically connected to respective outputs of a commercially well known common-cathode 7-segment decoder 23. The cathodes of all red LEDs 2a, 2b, 2c, 2d, 2e, 2f, 2g, and 2i are interconnected to a common electric path referred to as a red bus 5. The cathodes of all green LEDs 3a, 3b, 3c, 3d, 3e, 3f, 3g, and 3i are interconnected to a like common electric path referred to as a green bus 6.

The red bus 5 is connected to the output of an inverting buffer 63a, capable of sinking sufficient current to forwardly bias all red LEDs 2a to 2i in display element 42. The green bus 6 is connected to the output of a like buffer 63b. The conditions of red bus 5 and green bus 6 can be controlled by applying suitable logic control signals to the color control inputs R (red), Y (yellow), and G (green), to illuminate display element 42 in a selected color.

The operation of display element 42 will be now explained by the example of illuminating a digit '7' in three different colors. Any digit between 0 and 9 can be selectively displayed by applying the appropriate BCD code to the inputs A0, A1, A2, and A3 of common-cathode 7-segment decoder 23. The decoder 23 develops at its outputs a, b, c, d, e, f, g, and DP drive signals for energizing selected groups of the segments to visually display the selected number, in a manner well known to those skilled in the art. To display decimal number '7', a BCD code 0111 is applied to the inputs A0, A1, A2, and A3. The decoder 23 develops high voltage levels at its outputs a, b, and c, to illuminate equally designated segments a, b, and c, and low voltage levels at all remaining outputs (not shown), to extinguish all remaining segments d, e, f, g, and DP.

To illuminate display element 42 in red color, the color control input R is raised to a high logic level, and the color control inputs Y and G are maintained at a low logic level. As a result, the output of OR gate 60a rises to a high logic level, thereby causing the output of buffer 63a to drop to a low logic level. The current flows from the output a of decoder 23, via red LED 2a and red bus 5, to current sinking output of buffer 63a. Similarly, the current flows from the output b of decoder 23, via red LED 2b and red bus 5, to the output of buffer 63a. The current flows from the output c of decoder 23, via red LED 2c and red bus 5, to the output of buffer 63a. As a result, segments a, b, and c illuminate in red color, thereby causing a visual impression of a character '7'. The green LEDs 3a, 3b, and 3c remain extinguished because the output of buffer 63b is at a high logic level, thereby disabling green bus 6.

To illuminate display element 42 in green color, the color control input G is raised to a high logic level, while the color control inputs R and Y are maintained at a low logic level. As a result, the output of OR gate 60b rises to a high logic level, thereby causing the output of buffer 63b to drop to a low logic level. The current flows from the output a of decoder 23, via green LED 3a and green bus 6, to current sinking output of buffer 63b. Similarly, the current flows from the output b of decoder 23, via green LED 3b and green bus 6, to the output of buffer 63b. The current flows from the output c of decoder 23, via green LED 3c and green bus 6, to the output of buffer 63b. As a result, segments a, b, and c illuminate in green color. The red LEDs 2a, 2b, and 2c remain extinguished because the output of buffer 63a is at a high logic level, thereby disabling red bus 5.

To illuminate display element 42 in yellow color, the color control input Y is raised to a high logic level, while the color inputs R and G are maintained at a low logic level. As a result, the outputs of both OR gates 60a and 60b rise to a high logic level, thereby causing the outputs of both buffers 63a and 63b to drop to a low logic level. The current flows from the output a of decoder 23, via red LED 2a and red bus 5, to current sinking output of buffer 63a, and, via green LED 3a and green bus 6, to current sinking output of buffer 63b. Similarly, the current flows from the output b of decoder 23, via red LED 2b and red bus 5, to the output of buffer 63a, and, via green LED 3b and green bus 6, to the output of buffer 63b. The current flows from the output c of decoder 23, via red LED 2c and red bus 5, to the output of buffer 63a, and, via green LED 3c and green bus 6, to the output of buffer 63b. As a result of blending light of red and green colors in each segment, segments a, b, and c illuminate in substantially yellow color.

In FIG. 2, red LED 2e and green LED 3e are placed on the base of a segment body 15 which is filled with a transparent light scattering material 16. When forwardly biased, LEDs 2e and 3e emit light signals of red and green colors, respectively, which are scattered within transparent material 16, thereby blending the red and green light signals into a composite light signal that emerges at the upper surface of segment body 15. The color of the composite light signal may be controlled by varying the portions of the red and green light signals.

The description of a variable color digital display system shown in FIG. 3, which is capable of emphasizing the position of a decimal point in a string of digits, should be considered together with its accompanying timing diagram viewed in FIG. 4. The display system, which in its exemplary embodiment utilizes eight single-digit variable color displays 46a to 46h, of which only displays 46a, 46b, and 46h are shown, is capable of detecting the position of a decimal point in a string of exhibited digits and of exhibiting in a first color all digits that precede the decimal point and in a second color all digits that follow the decimal point. The decimal point outputs DP of common-cathode 7-segment decoders 23a, 23b to 23h, which may receive displayable data in a conventional manner (not shown), are scanned in a cyclic sequence by a multiplexer 146 which is incremented by a counter 162d driven by clock 199j of a suitable frequency. When an active high DP output is detected on a certain of decoders 23a, 23b to 23h, the inverting output W of multiplexer 146, which is connected to the Set Direct input SD of DP flip-flop 138j, drops to a low logic level 199n, to force the latter to its set condition. The Q output of DP flip-flop 138j, which is connected to the D inputs of all flip-flops 138b to 138h, rises to a high logic level for the remaining time of the scanning cycle, to thereby indicate, as may be best observed in FIG. 4 in the line designated F-F 138j Q OUTPUT at waveform 199p, the position of the detected decimal point in reference to the scanning cycle. The decoder 166 is incremented synchronously with multiplexer 146, and, as a result, its outputs Y0 to Y7 are sequentially driven to a low logic level, to trigger in a sequence flip-flops 138b to 138h to states determined by the conditions of their D inputs, respectively, at the time of triggering, as may be best observed in FIG. 4 in the lines designated DEC 166 OUTPUTS Y0 to Y7 at waveforms 199a to 199h. All flip-flops 138b to 138h, which were triggered before the decimal point was located during the scanning cycle, are triggered to their reset state, while all remaining flip-flops 138b to 138h, which were triggered after the decimal point was located, are triggered to their set state. The Y7 output of decoder 166 is connected to the Clear Direct input CD of DP flip-flop 138j, to force the latter to its reset condition at the end of each scanning cycle. The outputs Q and $\overline{Q}$ of flip-flops 138b to 138h are respectively connected to color control inputs R and G of color controls 52b to 52h, to thereby cause all display digits 46b to 46h that precede the instant decimal point to be illuminated in green color, and all remaining display digits 46b to 46h that follow the decimal point to be illuminated in red color. It would be obvious that other color combinations may be devised.

In brief summary, the invention describes a method of emphasizing the position of a decimal point in an exhibited string of digits by detecting the position of the decimal point in the string of digits, by illuminating in a first color all digits that precede the decimal point, and by illuminating in a second color all digits that follow the decimal point.

A display device was disclosed which includes a plurality of side by side positioned variable color digital display elements on which a string of digits with a decimal point may be exhibited. The string of digits is scanned by a multiplexer to determine the position of the decimal point. Color control accordingly illuminates in a first color all display elements that precede the decimal point and in a second color all display elements that follow the decimal point.

It would be obvious that persons skilled in the art may resort to modifications in the construction of the preferred embodiment described herein, without departing from the spirit and scope of the invention as defined in the appended claims. It is contemplated that the principles of the invention are also applicable to numerous diverse types of display devices, such are luminescent devices, liquid crystal devices, plasma devices, fluorescent devices, and the like.

| CORRELATION TABLE |
|---|
| This is a correlation table of reference characters used in the drawings herein, their descriptions, and examples of commercially available parts. |

| # DESCRIPTION | EXAMPLE |
|---|---|
| 2 red LED | |
| 3 green LED | |
| 5 red bus | |
| 6 green bus | |
| 15 segment body | |
| 16 light scattering material | |

-continued
CORRELATION TABLE
This is a correlation table of reference characters used in the drawings herein, their descriptions, and examples of commercially available parts.

| # | DESCRIPTION | EXAMPLE |
|---|---|---|
| 23 | common cathode 7-segment decoder | 74LS49 |
| 42 | variable color 7-segment display element | |
| 46 | variable color 7-segment display digit | |
| 52 | color control | |
| 60 | 2-input OR gate | 74HC32 |
| 63 | inverting buffer | 74LS240 |
| 138 | D-type flip-flop | 74HC74 |
| 146 | 8-input digital multiplexer | 74HC151 |
| 162 | 4-bit binary counter | 74HC161 |
| 166 | 1-to-8 lines decoder | 74HC138 |
| 199 | pulse | |

What I claim is:

1. A display device comprising:
a plurality of adjacent variable color digital display elements, each said display element including a plurality of display segments and a decimal point segment for selectively exhibiting a plurality of strings of digits with a decimal point;
decoder means having a plurality of inputs for receiving input codes defining a string of digits with a decimal point, a plurality of decoder outputs for developing drive signals for selectively energizing said display segments, and a plurality of decimal point outputs for developing drive signals for energizing a certain of said decimal point segments, in accordance with said input codes;
means responsive to said decoder outputs and to said decimal point outputs for exhibiting on said display means the string of digits with the decimal point;
means for interrogating said decimal point outputs to determine the position of the decimal point in the string of digits and for developing an output signal accordingly; and
color control means responsive to said output signal for illuminating in a first color all digits in the string that precede the decimal point, and for illuminating in a second color all digits in the string that follow the decimal point.

2. A display device of claim 1 wherein said means for interrogating include a multiplexer and a counter for driving said multiplexer for scanning in a cyclic sequence said decimal point outputs to determine the position of the decimal point in the string of digits.

3. A display device of claim 1 further including memory means responsive to said output signal for storing a value representing the position of the decimal point in the string of digits.

4. A display device of claim 1 wherein:
said means for interrogating include a multiplexer and a counter for driving said multiplexer for scanning in a cyclic sequence said decimal point outputs to determine the position of the decimal point in the string of digits, thereby defining a scanning cycle, said multiplexer having a multiplexer output for developing a multiplexer output signal when an active decimal point output is detected; and
a flip-flop responsive to said multiplexer output signal for being set when the active decimal point output is detected, to thereby indicate the position of the detected active decimal point output in reference to the scanning cycle.

5. A display device comprising:
a plurality of side by side positioned variable color digital display elements, each said display element including a plurality of display segments and a decimal point segment;
a plurality of decoders respectively associated with said display elements, each said decoder having a plurality of inputs for receiving an input code defining a digit, a plurality of decoder outputs for developing drive signals for energizing selective groups of display segments in the associated display element, and a decimal point output for developing an active decimal point drive signal for energizing the decimal point segment in the associated display element, in accordance with the input codes;
means responsive to the decoder outputs and to the decimal point outputs for exhibiting on said display elements a string of digits with a decimal point;
means for sequentially interrogating the decimal point outputs of said decoders to detect an active decimal point drive signal and for developing an output signal when said active decimal point drive signal is detected; and
color control means for sequentially scanning respective display elements, in alignment with the interrogating of the decimal point outputs of respective decoders, said color control means being responsive to said output signal for illuminating in a first color all display elements that were scanned before said active decimal point drive signal was detected, and for illuminating in a second color all display elements that were scanned after said active decimal point drive signal was detected.

6. A display device comprising:
a plurality of side by side positioned variable color digital display elements, each said display element including a plurality of display segments and a decimal point segment;
a plurality of decoders respectively associated with said display elements, each said decoder having a plurality of inputs for receiving an input code defining a digit, a plurality of decoder outputs for developing drive signals for energizing selective groups of display segments in the associated display element, and a decimal point output for developing an active decimal point drive signal for energizing the decimal point segment in the associated display element, in accordance with the input codes;
means responsive to the decoder outputs and to the decimal point outputs for exhibiting on said display elements a string of digits with a decimal point;
multiplexer means for sequentially scanning the decimal point outputs of said decoders to detect an active decimal point drive signal and for developing a multiplexer output signal when said active decimal point drive signal is detected;
decimal point memory means responsive to said multiplexer output signal for being set to a first condition when the active decimal point drive signal is detected, said decimal point memory means having a memory output for developing an active memory output signal indicating the position of the detected decimal point in reference to the scanning cycle; and
color control means responsive to said active memory output signal and including a plurality of flip-flops respectively associated with said display elements, said color control means sequentially triggering said flip-flops in alignment with the scanning of said decimal point outputs, for setting to a first condition all flip-flops that were triggered before said active memory output signal occurs, to cause all associated display elements to be illuminated in a first color, and for setting to a second condition all flip-flops that were triggered after said active memory output signal occurs, to cause all associated display elements to be illuminated in a second color.

* * * * *